United States Patent
Kwon (10) Patent No.: US 7,292,094 B2
(45) Date of Patent: Nov. 6, 2007

(54) GAIN CONTROL AMPLIFIER

(75) Inventor: Dae-hoon Kwon, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 117 days.

(21) Appl. No.: 11/322,390

(22) Filed: Jan. 3, 2006

(65) Prior Publication Data
US 2006/0176110 A1 Aug. 10, 2006

(30) Foreign Application Priority Data
Feb. 4, 2005 (KR) .................. 10-2005-0010739

(51) Int. Cl.
*H03F 1/02* (2006.01)
(52) U.S. Cl. ........................................... 330/9
(58) Field of Classification Search .............. None
See application file for complete search history.

(56) References Cited

U.S. PATENT DOCUMENTS

| | | | | |
|---|---|---|---|---|
| 4,356,450 A | * | 10/1982 | Masuda | 330/9 |
| 4,633,223 A | * | 12/1986 | Senderowicz | 341/118 |
| 5,789,974 A | | 8/1998 | Ferguson, Jr. et al. | |
| 5,796,301 A | * | 8/1998 | Tanabe et al. | 330/9 |
| 5,867,777 A | * | 2/1999 | Yamaji et al. | 455/234.1 |
| 6,566,946 B2 | * | 5/2003 | Llewellyn | 330/69 |
| 6,657,488 B1 | * | 12/2003 | King et al. | 330/9 |
| 6,734,746 B1 | * | 5/2004 | Nogi | 331/81 |
| 6,756,924 B2 | * | 6/2004 | Lee et al. | 341/120 |
| 6,812,787 B2 | * | 11/2004 | Kimura | 330/69 |
| 7,068,090 B2 | * | 6/2006 | Hirabayashi et al. | 327/307 |
| 7,072,427 B2 | * | 7/2006 | Rawlins et al. | 375/346 |
| 7,095,275 B2 | * | 8/2006 | Miyazaki | 330/9 |
| 7,098,716 B2 | * | 8/2006 | Ono | 327/307 |
| 2006/0100540 A1 | * | 5/2006 | Gozani et al. | 600/554 |
| 2006/0255855 A1 | * | 11/2006 | Nakao | 330/9 |

FOREIGN PATENT DOCUMENTS

JP 08-288759 11/1998

OTHER PUBLICATIONS

Korean Office Action dated Jul. 31, 2006 issued in Korean Patent Application No. 2005-10739.

* cited by examiner

*Primary Examiner*—Robert Pascal
*Assistant Examiner*—Krista M Flanagan
(74) *Attorney, Agent, or Firm*—Sughrue Mion, PLLC

(57) ABSTRACT

A gain control amplifier is provided including: a non-inverting amplifier receiving an input voltage and a direct current reference voltage, and non-inverting amplifying and outputting an alternating component of the input voltage using a predetermined voltage gain based on the direct current reference voltage; and an offset compensator removing a direct current offset component from an output voltage of the non-inverting amplifier using at least two operational amplifiers. The non-inverting amplifier includes: a ladder-shaped resistor varying the voltage gain according to a digital control signal input from an external source.

21 Claims, 10 Drawing Sheets

GAIN CONTROL AMPLIFIER

CROSS-REFERENCE TO RELATED APPLICATIONS

This application claims the benefit of Korean Patent Application No. 2005-10739, filed Feb. 4, 2005, in the Korean Intellectual Property Office, the disclosure of which is incorporated herein by reference.

BACKGROUND OF THE INVENTION

1. Field of the Invention

The present invention relates to a gain control amplifier, and more particularly, to a gain control amplifier outputting a voltage from which a direct current (DC) offset component has been removed.

2. Description of the Related Art

In general, an operational amplifier (hereinafter, referred to as an OP AMP) used in a gain control amplifier includes an input offset voltage caused by mismatching occurring in a fabricating process. Thus, a voltage output from the gain control amplifier includes an undesired DC offset component. Therefore, a compensation must be performed with respect to the undesired DC offset component to obtain an output voltage a user desires to obtain.

Figure 1:
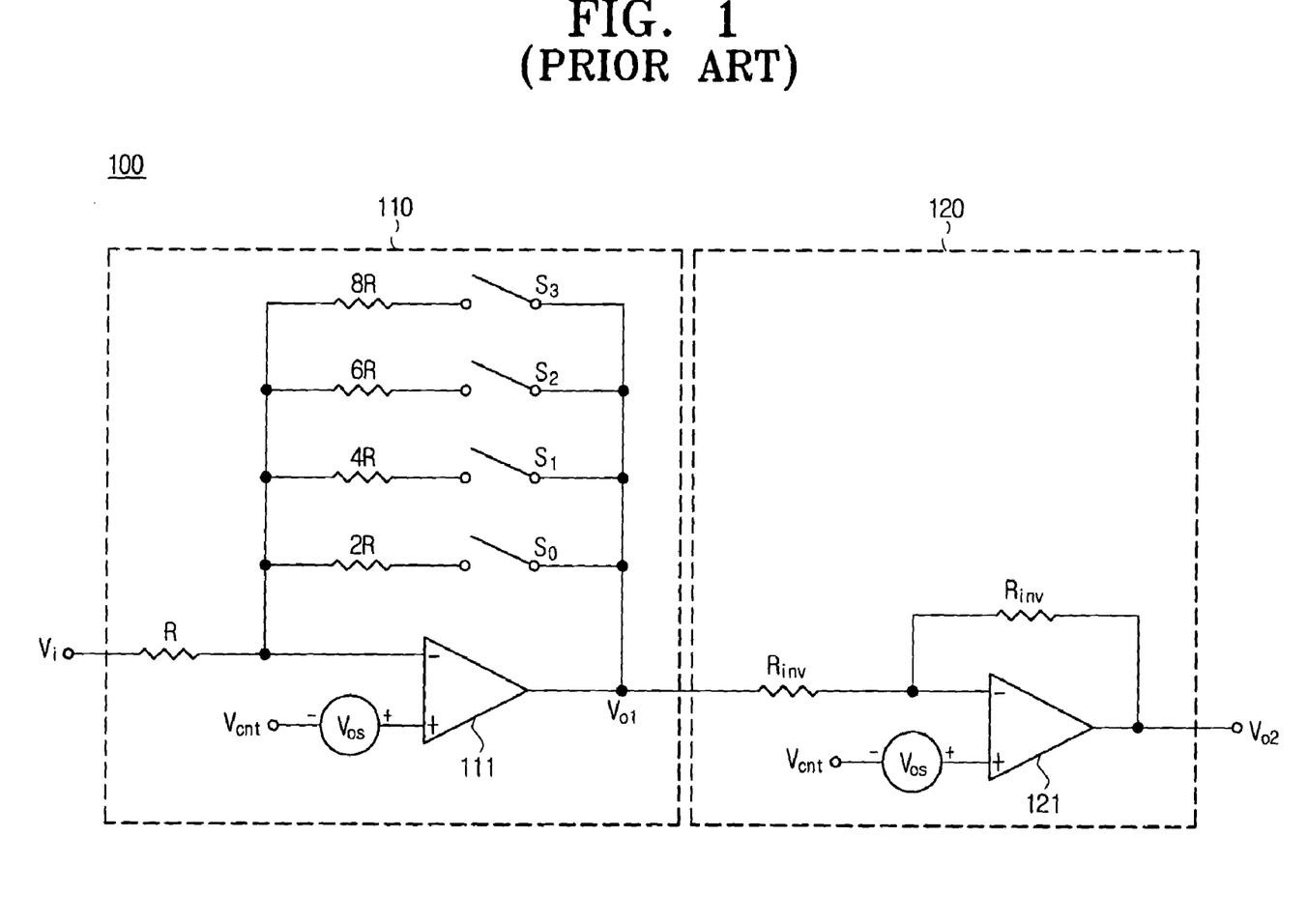
FIG. 1 is a circuit diagram illustrating an example of a conventional gain controller.

FIG. 1 is a circuit diagram illustrating an example of a conventional gain control amplifier. Referring to FIG. 1, a gain control amplifier 100 includes first and second inverting amplifiers 110 and 120. The first inverting amplifier 110 has a structure in which a plurality of feedback resistors 2R, 4R, 6R, and 8R are connected to one another in parallel between a non-inverting terminal and an output terminal of an OP AMP 111, and a plurality of switches $S_0$, $S_1$, $S_2$, and $S_3$ are respectively connected to the plurality of feedback resistors 2R, 4R, 6R, and 8R in series. Only one of the plurality of switches S0, S1, S2, and S3 is turned on and the others are turned off according to a 2-bit digital control signal input via a 2-to-4 decoder (not shown) so that only one of the plurality of feedback resistors 2R, 4R, 6R, and 8R selectively connects the non-inverting and output terminals of the OP AMP 111. Thus, the first inverting amplifier 110 inversely amplifies an alternating component of an input signal $V_i$ using one of voltage gains 2, 4, 6, and 8 based on a DC reference voltage $V_{cnt}$ to output a voltage $V_{o1}$.

If the voltage $V_{o1}$ output from the first inverting amplifier 110 is applied to an inverting terminal of an OP AMP 121 of the second inverting amplifier 120 and the DC reference voltage $V_{cnt}$ is applied to a non-inverting terminal of the OP AMP 121, a resistance value of a resistor $R_{inV}$ receiving the voltage $V_{o1}$ and applying the voltage $V_{o1}$ to the inverting terminal of the OP AMP 121 is equal to a resistance value of a resistor $R_{inv}$ connecting the inverting and output terminals of the OP AMP 121. Thus, the second inverting amplifier 120 re-inverts and outputs the voltage $V_{o1}$ without a voltage gain. As a result, the gain control amplifier 100 non-inverting amplifies the alternating component of the input signal $V_i$ using one of the voltage gains 2, 4, 6, and 8 based on the DC reference voltage $V_{cnt}$ to output a voltage $V_{o2}$. Voltage powers $V_{os}$ connected to the non-inverting terminals of the OP AMPs 111 and 121 indicate an input offset voltage of the OP AMPs 111 and 121. Thus, hereinafter, a voltage power $V_{os}$ connected to a non-inverting terminal of each OP AMP indicates an input offset voltage of OP AMPs. Here, it is supposed that offsets of adjacent OP AMPs in a chip have almost similar characteristics and thus have the same magnitude.

Figure 2A:
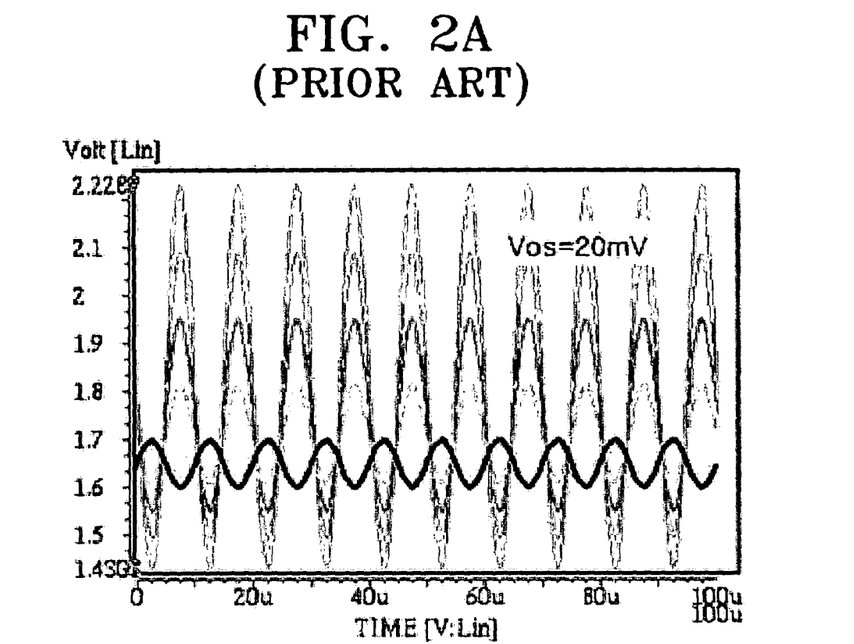
FIGS. 2A through 2C are graphs illustrating a relationship between input and output voltages of a first inverting amplifier shown in FIG. 1.
Figure 2B:
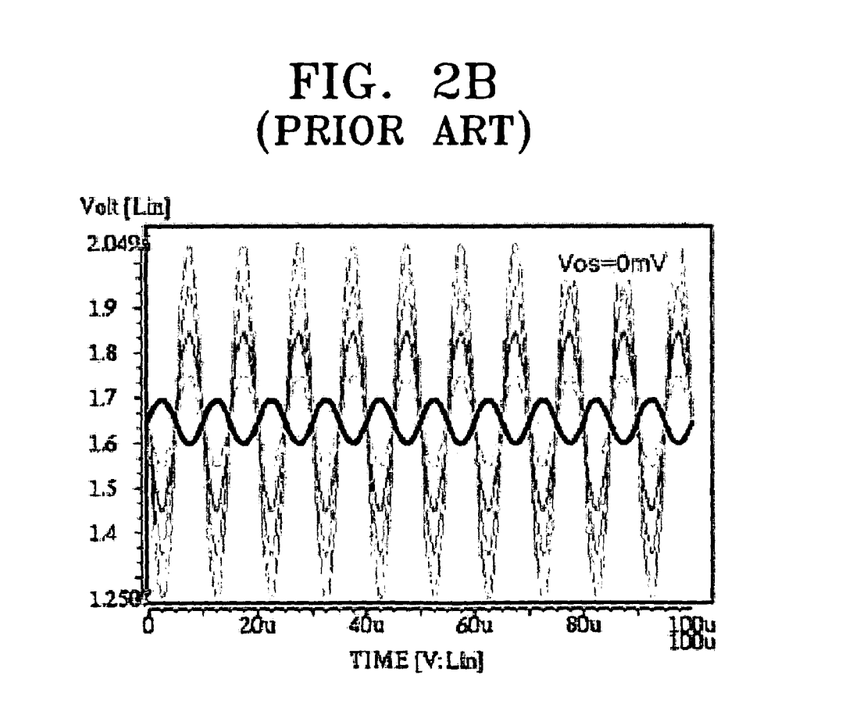
Figure 2C:
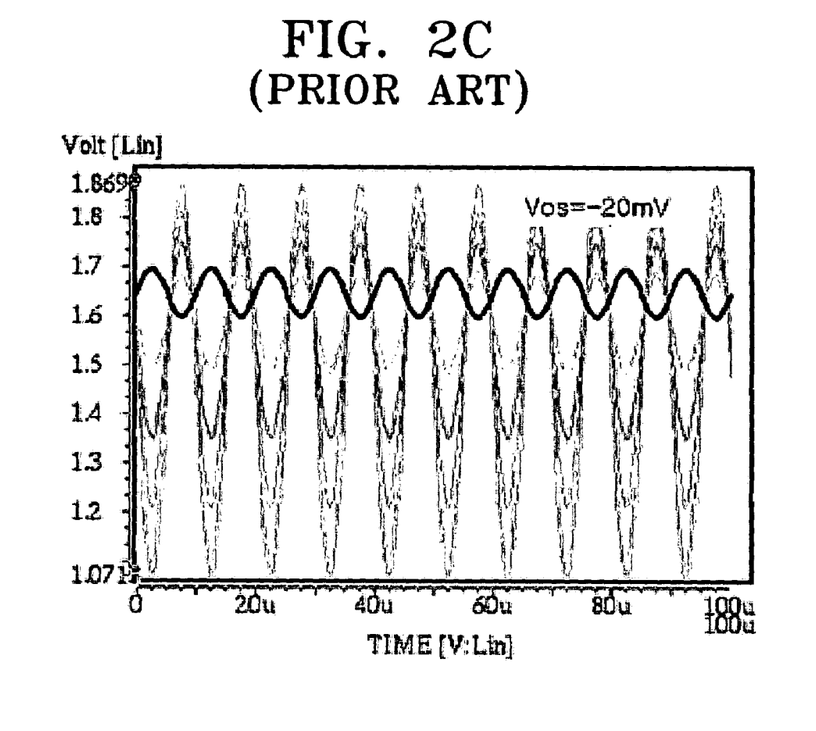

FIGS. 2A through 2C illustrate a relationship between the voltage $V_i$ input to the first inverting amplifier 110 and the voltage $V_{o1}$ output from the first inverting amplifier 110 when the DC reference voltage $V_{cnt}$ is 1.65V and the input offset voltage $V_{os}$ is 20 mV, 0 mV, or −20 mV. Here, bold lines denote the input voltage $V_i$, and slender lines denote the output voltage $V_{o1}$ generated by inverting amplifying the alternating component of the input voltage $V_i$ using one of the voltage gains 2, 4, 6, and 8. In a case where the input offset voltage $V_{os}$ of the OP AMPs 111 and 121 is 0 mV, the output voltage $V_{o1}$ does not include a DC offset component as shown in FIG. 2B. In a case where the input offset voltage $V_{os}$ is 20 mV or −20 mV, the output voltage $V_{o1}$ includes an undesired DC offset component as shown in FIGS. 2A and 2C.

Figure 3:
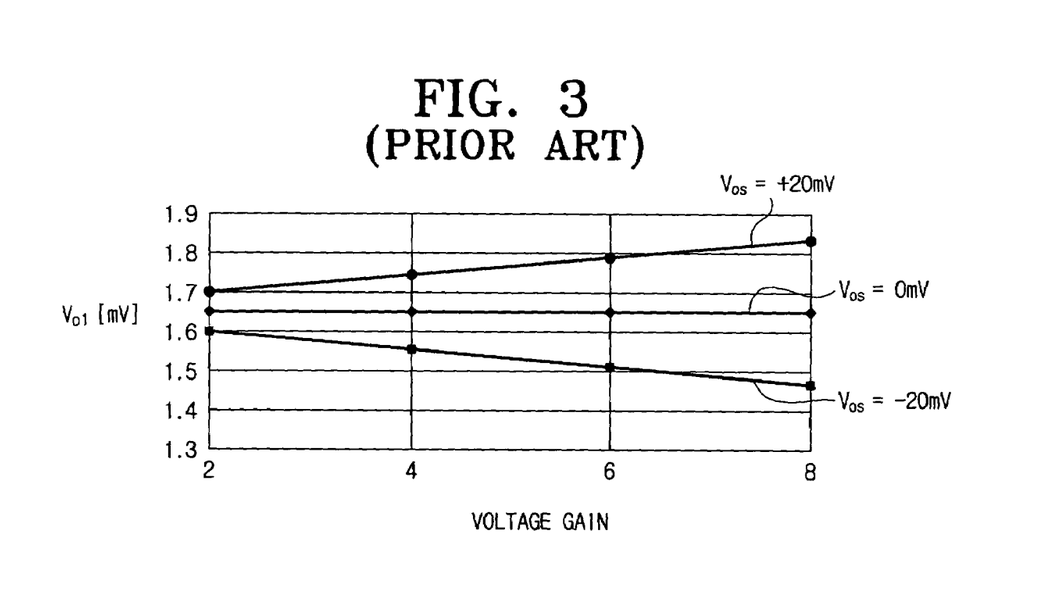
FIG. 3 is a graph illustrating DC levels of the output voltage of the first inverting amplifier shown in FIG. 1.

FIG. 3 is a graph illustrating DC levels of the output voltage $V_{o1}$ of the first inverting amplifier 110. Here, a horizontal axis denotes a voltage gain, and a vertical axis denotes DC levels of the output voltage $V_{o1}$. In a case where the input offset voltage $V_{os}$ is 0 mV, a DC level of the output voltage $V_{o1}$ is kept at 1.65V that is the DC reference voltage. In a case where the input offset voltage $V_{os}$ is 20 mV, the DC level of the output voltage $V_{o1}$ is gradually increased with an increase of the voltage gain. In a case where the input offset voltage $V_{os}$ is −20 mV, the DC level of the output voltage $V_{o1}$ is gradually decreased with the increase of the voltage gain. In other words, an effect of the undesired DC offset component on the output voltage $V_{o1}$ is increased with the increase of the voltage gain.

Figure 4:
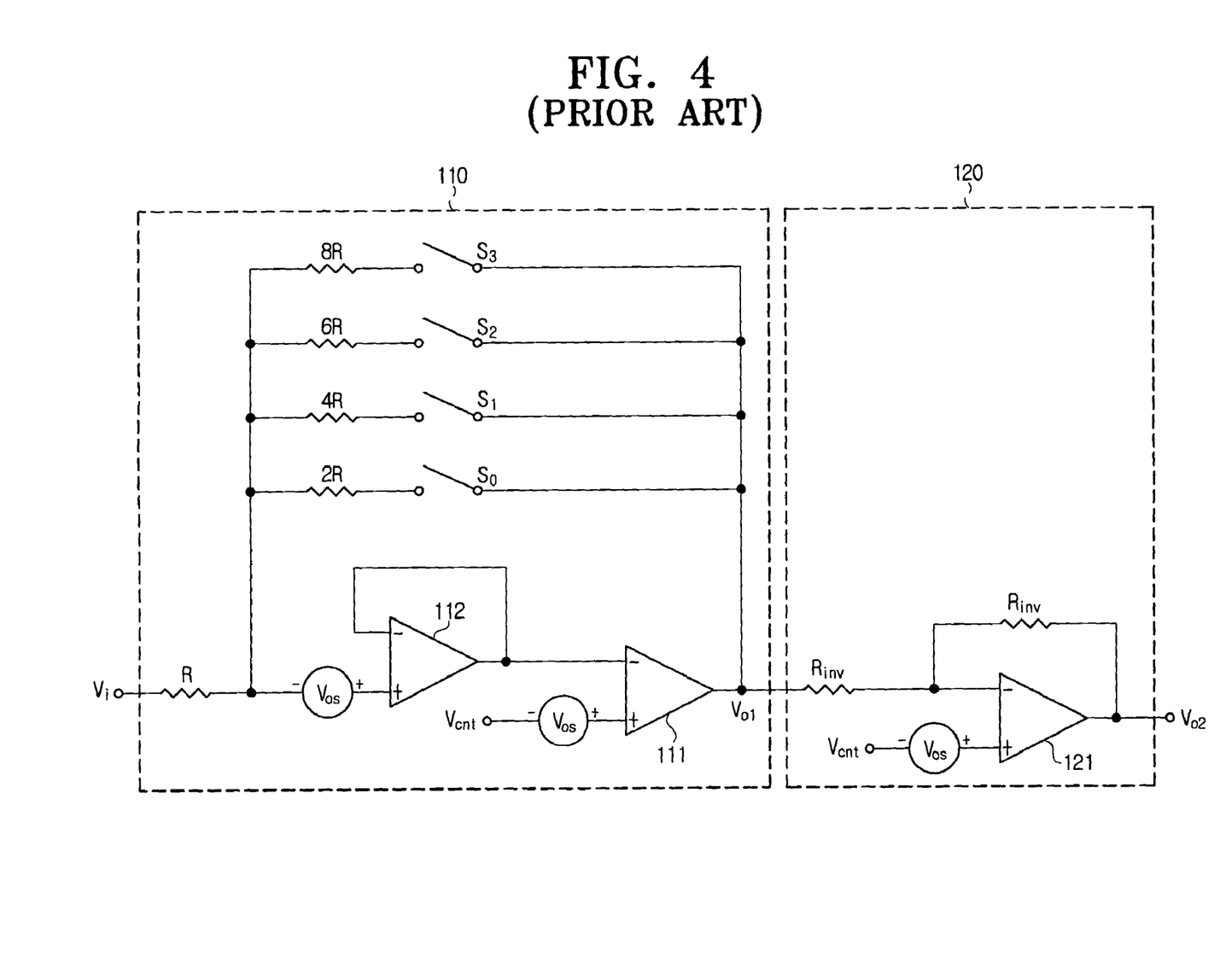
FIG. 4 is a circuit diagram of a gain control amplifier in which an effect of a DC offset component has been improved by inserting an OP AMP into the first inverting amplifier shown in FIG. 1 in the form of voltage follower.

FIG. 4 is a circuit diagram of a gain control amplifier in which an effect of a DC offset component has been improved by inserting an OP AMP 112 into the first inverting amplifier 110 shown in FIG. 1 in the form of voltage follower. If the OP AMP 112 is inserted in the form of a voltage follower as shown in FIG. 4, the input offset voltage $V_{os}$ of the OP AMP 111 is offset by an input offset voltage $V_{os}$ of the OP AMP 112. Thus, the DC offset component is removed from the output voltage $V_{o1}$.

Figure 5A:
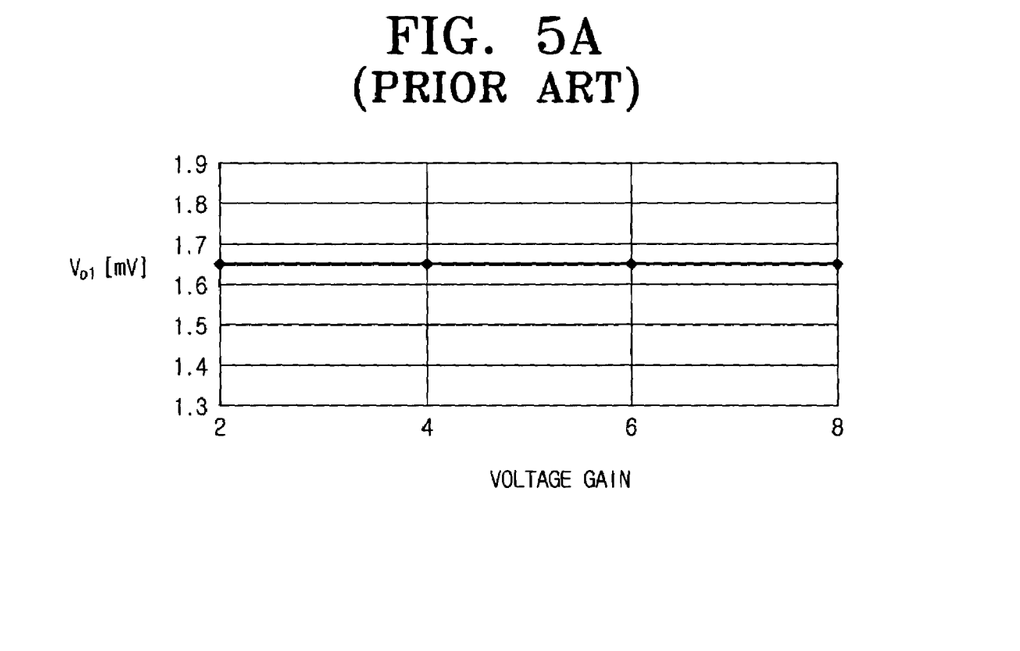
FIGS. 5A and 5B are graphs illustrating DC levels of output voltages of first and second inverting amplifiers shown in FIG. 4.
Figure 5B:
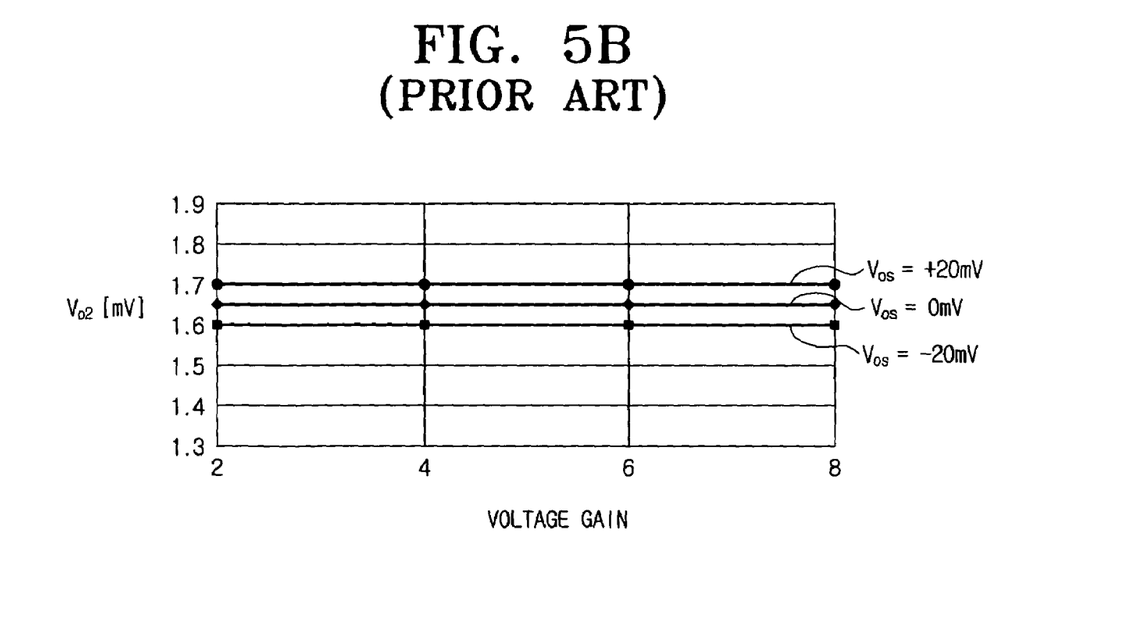

FIGS. 5A and 5B are graphs respectively illustrating DC levels of the output voltages $V_{o1}$ and $V_{o2}$ of the first and second inverting amplifiers 110 and 120 shown in FIG. 4. Referring to FIGS. 5A and 5B, horizontal axes denote a voltage gain, and vertical axes respectively denote DC levels of the output voltages $V_{o1}$ and $V_{o2}$.

As shown in FIG. 5A, the DC level of the output voltage $V_{o1}$ of the first inverting amplifier 110 is 1.65V and thus does not include the DC offset component due to the OP AMP 112 inserted in the form of voltage follower. However, the output voltage $V_{o2}$ of the second inverting amplifier 120 still includes a DC offset component as shown in FIG. 5B.

Accordingly, the DC offset component is not completely removed from the conventional gain control amplifier 100. Also, an OP AMP must be additionally used in the form of voltage follower to remove a DC offset component from the second inverting amplifier 120. Thus, the area of a chip is increased, and power consumption is increased.

In addition, in a case where a voltage gain is controlled at $2^N$ stages using an N-bit digital control signal, the conventional gain control amplifier 100 requires an N-to-$2^N$ decoder and $2^N$ feedback resistors.

SUMMARY OF THE INVENTION

Accordingly, the present invention has been made to solve the above-mentioned and/or problems, and an aspect of the present invention is to provide a gain control amplifier removing a DC offset component from an output voltage and variably controlling a voltage gain according to a digital control signal without a decoder.

According to an aspect of the present invention, there is provided a gain control amplifier including: a non-inverting amplifier receiving an input voltage and a DC reference voltage, and non-inverting amplifying and outputting an alternating component of the input voltage using a predetermined voltage gain based on the DC reference voltage; and an offset compensator removing a DC offset component from an output voltage of the non-inverting amplifier using at least two operational amplifiers.

The non-inverting amplifier may include: a ladder-shaped resistor varying the voltage gain according to a digital control signal input from an external source; and a first operational amplifier unit including a first operational amplifier, receiving a voltage output from the ladder-shaped resistor via an inverting terminal, and receiving the input voltage and the offset compensation voltage via a non-inverting terminal.

The ladder-shaped resistor may include: a second resistor including an end receiving the DC reference voltage; a plurality of serial resistors connected in series between another end of the second resistor and the inverting terminal of the first operational amplifier; a plurality of parallel resistors comprising ends connected to the plurality of serial resistors to form an R-2R ladder structure; and a plurality of switches selectively applying one of the input voltage and the DC reference voltage to other ends of the plurality of parallel resistors according to the digital control signal.

The offset compensator may include: a second operational amplifier unit including a second operational amplifier, receiving the DC reference voltage, and outputting a voltage having a magnitude obtained by adding a voltage including a DC offset component of the second operational amplifier amplified to a predetermined magnitude to the DC reference voltage; and a third operational amplifier unit including a third operational amplifier including an inverting terminal receiving an output voltage of the second operational amplifier unit and a non-inverting terminal receiving the DC reference voltage.

According to another aspect of the present invention, there is provided a gain control amplifier including: an inverting amplifier receiving an input voltage and a DC reference voltage, and inverting amplifying and outputting an alternating component of the input voltage using a predetermined voltage gain based on the DC reference voltage; and an offset compensator receiving an output voltage of the inverting amplifier and removing a DC offset component from the output voltage.

The inverting amplifier may include: a ladder-shaped resistor varying the voltage gain according to a digital control signal input from an external source; and a first operational amplifier unit including a first operational amplifier, receiving a voltage output from the ladder-shaped resistor via an inverting terminal, and receiving the DC reference voltage via a non-inverting terminal.

The ladder-shaped resistor may include: a second resistor including an end receiving the DC reference voltage; a plurality of serial resistors connected in series between another end of the second resistor and the inverting terminal of the first operational amplifier; a plurality of parallel resistors including ends connected to connecting nodes of the plurality of serial resistors; and a plurality of switches selectively applying one of the input voltage and the DC reference voltage to other ends of the plurality of parallel resistors according to the digital control signal.

The offset compensator may include: a second operational amplifier unit including a second operational amplifier, receiving the DC reference voltage, and outputting a voltage having a magnitude obtained by adding a voltage comprising a DC offset component of the second operational amplifier amplified to a predetermined magnitude to the DC reference voltage; and a third operational amplifier unit including a third operational amplifier including an inverting terminal receiving an output voltage of the second operation amplifier unit and a non-inverting terminal receiving the output voltage of the inverting amplifier and the DC reference voltage.

BRIEF DESCRIPTION OF THE DRAWINGS

The above aspects and features of the present invention will be more apparent by describing certain embodiments of the present invention with reference to the accompanying drawings, in which.

DETAILED DESCRIPTION OF THE EXEMPLARY EMBODIMENTS

Certain embodiments of the present invention will be described in greater detail with reference to the accompanying drawings.

In the following description, same drawing reference numerals are used for the same elements even in different drawings. The matters defined in the description such as a detailed construction and elements are provided to assist in a comprehensive understanding of the invention.

A relationship between input and output voltages of a general differential amplifier will be described to assist in understanding a relationship between input and output voltages of a gain control amplifier according to the present invention prior to the description of the gain control amplifier according to the present invention.

Figure 6:
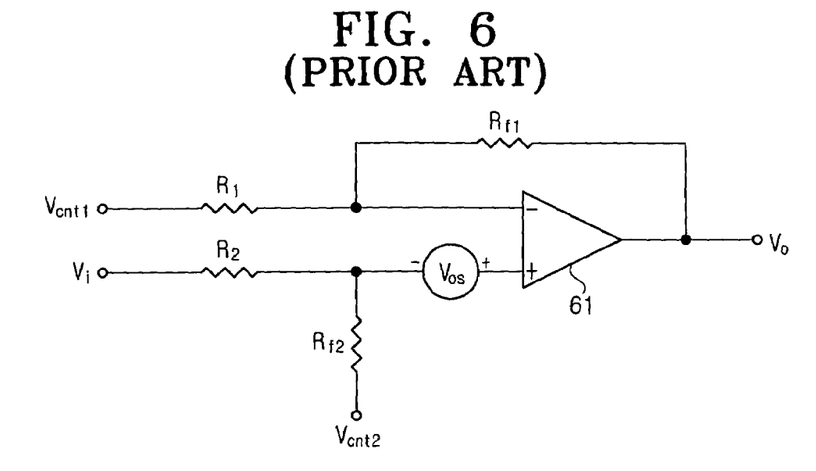
FIG. 6 is a circuit diagram illustrating a relationship between input and output voltages of a general differential amplifier.

FIG. 6 is a circuit diagram illustrating a relationship between input and output voltages of a general differential amplifier. Referring to FIG. 6, in a case where a first DC reference voltage $V_{cnt1}$ is input through a resistor $R_1$ to an inverting terminal of an OP AMP 61, an input voltage $V_i$ is distributed by resistors $R_2$ and $R_{f2}$ and then input to a non-inverting terminal of the OP AMP 61, a second DC reference voltage $V_{cnt2}$ is distributed by the resistors $R_2$ and $R_{f2}$ and then input to the non-inverting terminal of the OP AMP 61, and a magnitude of a resistance value is "$R_{f1}=R_{f2}=N \times R1=N \times R2$," an output voltage $V_0$ of the OP AMP 61 is expressed as in Equation 1:

$$Vo = (Vi - V_{cnt1}) \times G + V_{cnt2} + N \times Vos + Vos \quad (1)$$

wherein $V_{os}$ denotes an input offset voltage of the OP AMP 61, and G is a voltage gain of a difference $R_{f1}/R_1$ between the input voltage $V_i$ and the first DC reference voltage $V_{cnt1}$.

In general, a feedback resistor $R_{f1}$ is used within a range 4 to 10 times the resistor $R_1$. Thus, the output voltage $V_o$ in Equation 1 may approximated by Equation 2:

$$Vo = (Vi - V_{cnt1}) \times G + V_{cnt2} + N \times Vos \quad (2)$$

Figure 7:
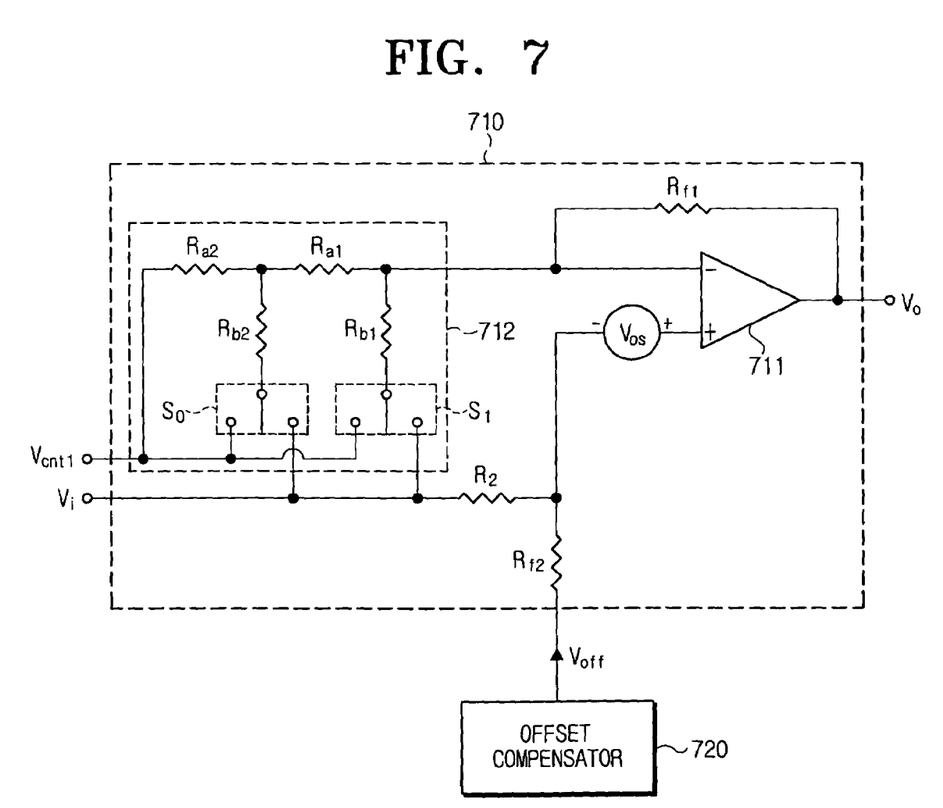
FIG. 7 is a circuit diagram of a gain control amplifier according to an embodiment of the present invention.

FIG. 7 is a circuit diagram of a gain control amplifier according to an embodiment of the present invention. Referring to FIG. 7, a gain control amplifier 700 includes a non-inverting amplifier 710 and an offset compensator 720. The non-inverting amplifier 710 receives an input voltage $V_i$ and a DC reference voltage $V_{cnt}$ and non-inverting amplifies an alternating component of the input voltage $V_i$ using a predetermined voltage gain based on the DC reference voltage $V_{cnt}$. The offset compensator 720 applies an offset compensation voltage $V_{off}$ to the non-inverting amplifier 710 so that the non-inverting amplifier 710 removes a DC offset component included in an output voltage $V_o$ due to an input offset voltage $V_{os}$ of an OP AMP 711.

The non-inverting amplifier 710 includes a ladder-shaped resistor 712, the OP AMP 711, and resistors $R_{f1}$, R2, and $R_{f2}$.

The ladder-shaped resistor 712 includes a plurality of serial resistors $R_{a1}$ and $R_{a2}$, a plurality of parallel resistors $R_{b1}$ and $R_{b2}$, and a plurality of switches $S_0$ and $S_1$. In detail, the serial resistors $R_{a1}$ and $R_{a2}$ are connected in series between a non-inverting terminal and a DC reference voltage input terminal of the OP AMP 711 and. Ends of the parallel resistors $R_{b1}$ and $R_{b2}$ are connected to the serial resistors $R_{a1}$ and $R_{a2}$ so as to form an R-2R ladder structure, and other ends of the parallel resistors $R_{b1}$ and $R_{b2}$ are connected to the plurality of switches $S_0$ and $S_1$. Resistance values of the serial resistor $R_{a2}$ and the parallel resistors $R_{b1}$ and $R_{b2}$ are set to be two times a resistance value of the serial resistor $R_{a1}$.

The switches $S_0$ and $S_1$ selectively input the input voltage $V_i$ and the DC reference voltage $V_{cnt}$ to the parallel resistors $R_{b1}$ and $R_{b2}$ according to a digital control signal input from an external source so that the non-inverting amplifier 710 varies the voltage gain G of the alternating component of the input voltage $V_i$. Here, in a case where the switch $S_1$ corresponds to a most significant bit (MSB) of the digital control signal, the switch $S_0$ corresponds to a least significant bit (LSB) of the digital control signal, a corresponding bit of the digital control signal is "1," the switches $S_0$ and $S_1$ apply the DC reference voltage $V_{cnt}$ to the parallel resistors $R_{b1}$ and $R_{b2}$. In a case where the digital control signal is "0,"  the switches $S_0$ and $S_1$ selectively apply the input voltage $V_i$ to the parallel resistors $R_{b1}$ and $R_{b2}$.

For example, if the digital control signal is "10," the switch $S_1$ applies the DC reference voltage $V_{cnt}$ to the parallel resistor $R_{b1}$, and the switch $S_0$ applies the input voltage $V_i$ to the parallel resistor $R_{b2}$. The voltage gain G varying with the digital control signal will be described in detail later.

The resistors $R_2$ and $R_{f2}$ distribute the input voltage $V_i$ and the offset compensation voltage $V_{off}$ to input the input voltage $V_i$ and the offset compensation voltage $V_{off}$ to the non-inverting terminal of the OP AMP 711, and the resistor $R_{f1}$ feeds back the output voltage $V_o$ to an inverting terminal of the OP AMP 711. A resistance value of the resistor $R_2$ is set to be equal to a resistance value of the serial resistor $R_{a1}$, and resistance values of the resistors $R_{f1}$ and $R_{f2}$ are set to be N times the resistance value of the serial resistor $R_{a1}$. Here, N is a constant that is a maximum voltage gain $G_{max}$ of the alternating component of the input voltage $V_i$.

The voltage gain G of the non-inverting amplifier 710 according to the present invention will now be described with reference to FIG. 8. For convenience, it is supposed that the resistance values of the resistors $R_{a1}$ and $R_2$ are each 10 k$\Omega$, the resistance values of the resistors $R_{a2}$, $R_{b1}$, and $R_{b2}$ are each 20 k$\Omega$, and the resistance values of the resistors $R_{f1}$ and $R_{f2}$ are each 80 k$\Omega$.

Figure 8:
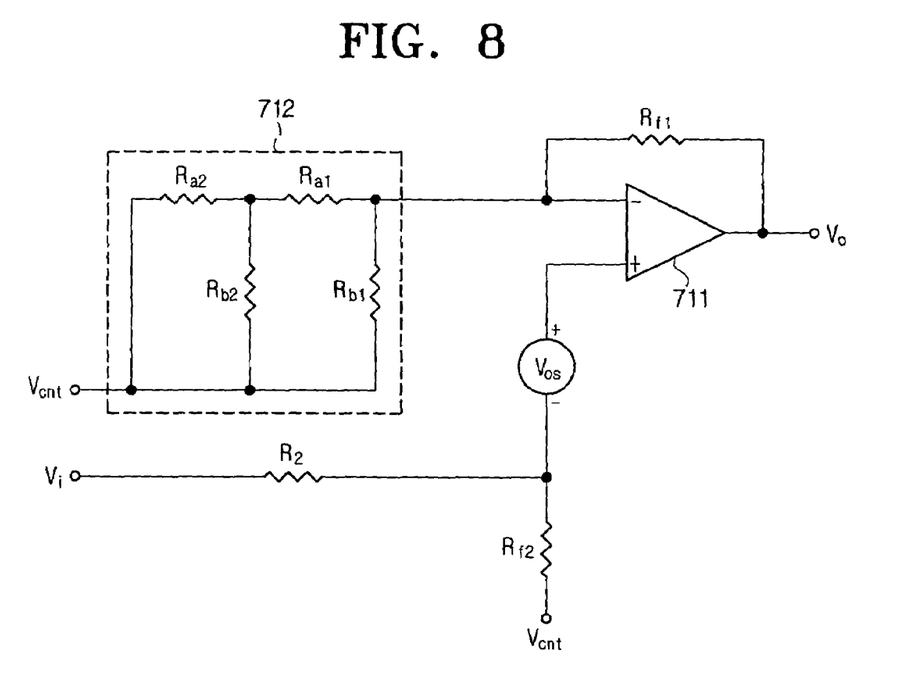
FIG. 8 is a circuit diagram illustrating a method of varying a voltage gain via a ladder-shaped resistor in the gain control amplifier shown in FIG. 7.

If the MSB and the LSB of the digital control signal are all "1," the DC reference voltage $V_{cnt}$ is applied to the parallel resistors $R_{b1}$ and $R_{b2}$ as shown in FIG. 8. Since the resistance values of the resistors $R_{a2}$, $R_{b1}$, and $R_{b2}$ are two times the resistance value of the resistor $R_{a1}$, an equivalent resistance of the ladder-shaped resistor 712 is equal to the resistance value of the resistor $R_{a1}$, i.e., 10 k$\Omega$. Thus, the voltage gain G is "8" through "80 k$\Omega$/10 k$\Omega$."

If the MSB of the digital control signal is "0" and the LSB of the digital control signal is "1," ½ of a current generated by the input voltage $V_i$ flows through the resistor $R_{b1}$ into the inverting terminal of the OP AMP 711. Thus, the voltage gain G is "4" through "8×[1–(½)]." If the MSB of the digital control signal "1" and the LSB of the digital control signal is "0," ¼ of the current generated by the input voltage $V_i$ flows through the resistor $R_{b2}$ into the inverting terminal of the OP AMP. Thus, the voltage gain G is "6" through "8×[1×(¼)]." Table 1 below shows the voltage gain G depending on the digital control signal.

TABLE 1

| Digital Control Signal | | |
|---|---|---|
| MSB | LSB | Voltage Gain |
| 0 | 0 | 2 |
| 0 | 1 | 4 |
| 1 | 0 | 6 |
| 1 | 1 | 8 |

It has been described in the present embodiment that a digital control signal is 2 bits and a voltage gain is controlled at four stages. However, it may be generalized about a voltage gain being controlled at $2^N$ stages using an N-bit digital control signal. In a case where the digital control signal is N bits, the ladder-shaped resistor 712 may be constituted so that N serial resistors $R_{a1}$, $R_{a2}$, ..., and $R_{aN}$ are connected in series between the inverting terminal of the OP AMP 711 and a DC reference voltage input terminal, ends of N parallel resistors $R_{b1}$, $R_{b2}$, ..., and $R_{bN}$ are connected to the N serial resistors $R_{a1}$, $R_{a2}$, ..., and $R_{aN}$ so as to form an R-2R ladder structure, and other ends of the N parallel resistors $R_{b1}$, $R_{b2}$, ..., and $R_{bN}$ are connected to a plurality of switches $S_0$, $S_1$, ..., and $S_{n-1}$ so as to vary a voltage gain at $2^N$ stages according to the N-bit digital control signal. Thus, the gain control amplifier 700 according to the present embodiment does not require a decoder and requires 2N resistors in terms of a feedback resistance. Here, the number, 2N of resistors is smaller than the number, $2^N$, resistors of the conventional gain control amplifier.

Referring to FIG. 7 again, the non-inverting amplifier 710 receives the input voltage $V_i$, the DC reference voltage $V_{cnt}$, and the offset compensation voltage $V_{off}$ to output the voltage $V_o$ approximately having a magnitude of "$[(V_i-V_{cnt})\times G]+V_{off}+N\times V_{os}$" from Equation 2.

Since a DC level of the input voltage $V_i$ generally synchronizes with the DC reference voltage $V_{cnt}$, a DC level of the output voltage $V_o$ is "$V_{off}+N\times V_{os}$." Thus, the offset compensation voltage $V_{off}$ must be "$V_{cnt}-N\times V_{os}$" to remove a DC offset component $N\times V_{os}$ from the output voltage $V_o$.

Figure 9:
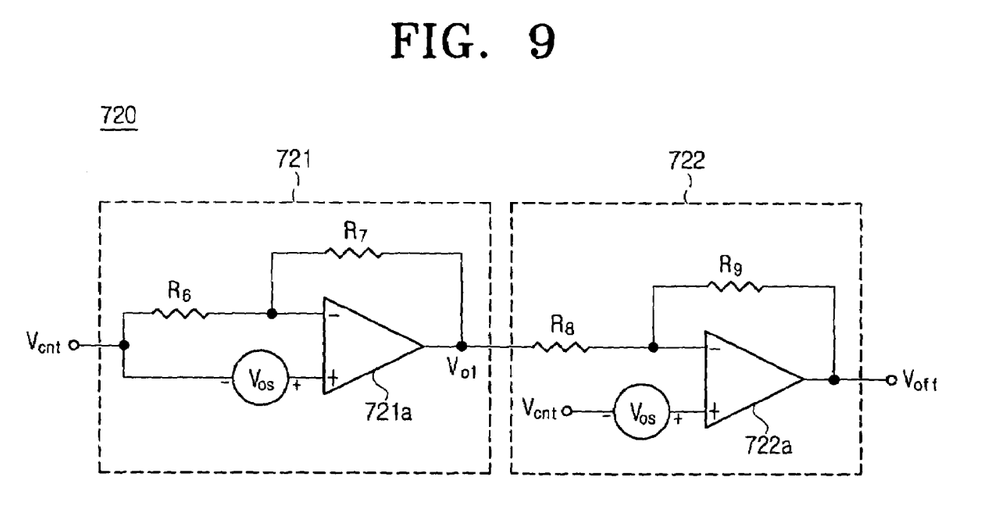
FIG. 9 is a detailed circuit diagram of an offset compensator shown in FIG. 7.

FIG. 9 is a detailed circuit diagram of the offset compensator 720 shown in FIG. 7. Referring to FIG. 9, the offset compensator 720 includes second and third OP AMP units 721 and 722 and outputs the offset compensation voltage $V_{off}$ having a magnitude of "$V_{cnt}-N\times V_{os}$."

The second OP AMP unit 721 is constituted so that the DC reference voltage $V_{cnt}$ is directly applied to a non-inverting terminal of an OP AMP 721a and simultaneously through a resistor $R_6$ to an inverting terminal of the OP AMP 721a. A resistor $R_7$ feeds back an output voltage of the OP AMP 721a to the inverting terminal of the OP AMP 721a and has a resistance value obtained by multiplying a magnitude of the resistor $R_6$ by N+1. According to this structure, the magnitude of a voltage $V_{o1}$ output from the OP AMP 721a is "$V_{cnt}+[(N+1)\times V_{os}]$."

The third OP AMP unit 722 is constituted so that the output voltage $V_{o1}$ of the OP AMP 721a is applied through a resistor $R_8$ to a non-inverting terminal of an OP AMP 722a and the DC reference voltage $V_{cnt}$ is simultaneously applied to the non-inverting terminal of the OP AMP 722a. Also, a resistor $R_9$ feeds back an output voltage of the OP AMP 722a to an inverting terminal of the OP AMP 722a, and the resistors $R_8$ and $R_9$ each have the same resistance value as that of the resistor $R_6$. According to this structure, the magnitude of a voltage $V_{off}$ output from the OP AMP 722a is "$V_{cnt}-N\times V_{os}$."

The output voltage $V_{off}$ of the OP AMP 722a as an offset compensation voltage is applied through the resistor $R_{f2}$ to the non-inverting terminal of the OP AMP 711 of the non-inverting amplifier 710 so as to remove the DC offset component from the output voltage $V_o$.

Figure 10:
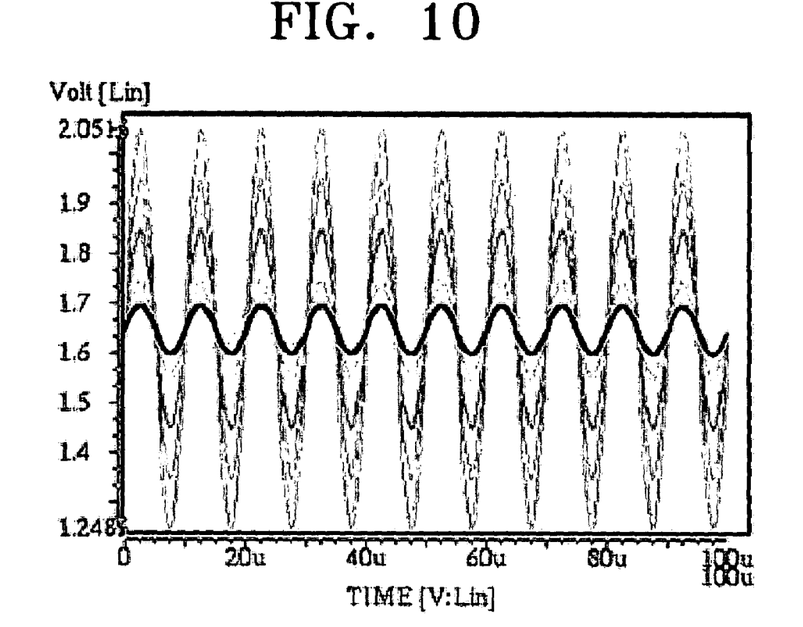
FIG. 10 is a graph illustrating a relationship between input and output voltages of the gain control amplifier shown in FIG. 7.

FIG. 10 is a graph illustrating a relationship between input and output voltages of the gain control amplifier shown in FIG. 7. Here, a horizontal axis denotes a time, and a vertical axis denotes strengths of input and output voltages. A bold line denotes the input voltage $V_i$, and slender solid lines denote the output voltage $V_o$ obtained by non-inverting amplifying the alternating component of the input voltage $V_i$ using the voltage gain 2, 4, 6, or 8. If an input offset voltage is −20 mV, 0 mV, or 20 mV, the output voltage $V_0$ does not include the DC offset component, and the DC level is kept at 1.65V as shown in FIG. 10.

Figure 11:
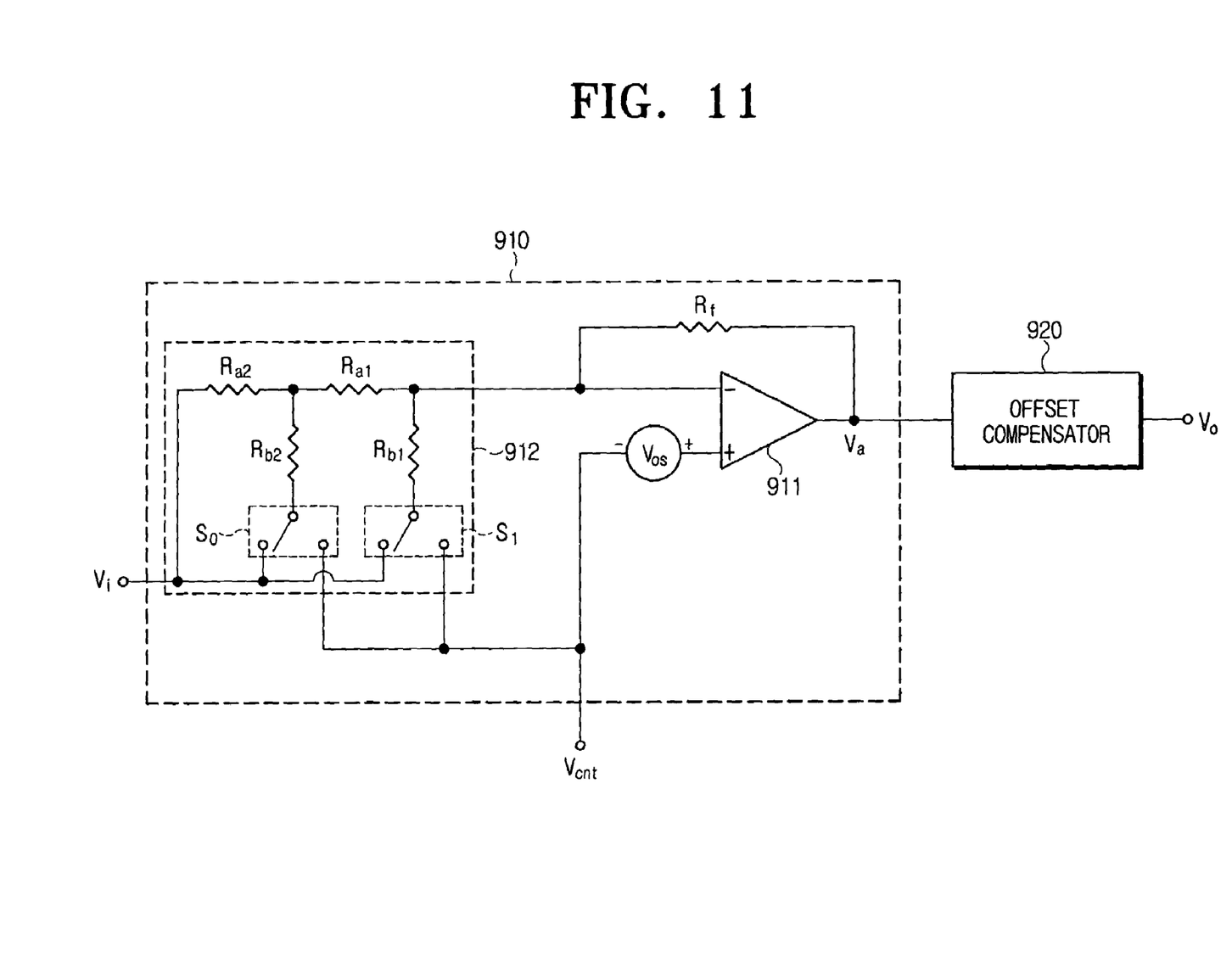
FIG. 11 is a circuit diagram of a gain control amplifier according to another embodiment of the present invention.

FIG. 11 is a circuit diagram of a gain control amplifier according to another embodiment of the present invention. Referring to FIG. 11, a gain control amplifier 900 according to the present embodiment includes an inverting amplifier 910 and an offset compensator 920. The inverting amplifier 910 receives an input voltage $V_i$ and a DC reference voltage $V_{cnt}$, and inverting amplifies and outputs an alternating component of the input voltage $V_i$ using a predetermined voltage gain based on the DC reference voltage $V_{cnt}$. The offset compensator 920 receives an output voltage $V_a$ of the inverting amplifier 910, removes a DC offset component from the output voltage $V_a$, and outputs the output voltage $V_o$.

The inverting amplifier 910 includes a ladder-shaped resistor 912, an OP AMP 911, and a resistor $R_f$.

The ladder-shaped resistor 912 includes a plurality of serial resistors $R_{a1}$ and $R_{a2}$, a plurality of parallel resistors $R_{b1}$ and $R_{b2}$, and a plurality of switches $S_0$ and $S_1$. In detail, the serial resistors $R_{a1}$ and $R_{a2}$ are connected in series between an inverting terminal of the OP AMP 911 and an input terminal of the input voltage $V_i$. Ends of the parallel resistors $R_{b1}$ and $R_{b2}$ are connected to the serial resistors $R_{a1}$ and $R_{a2}$ to form an R-2R ladder structure, and other ends of the parallel resistors $R_{b1}$ and $R_{b2}$ are connected to the plurality of switches $S_0$ and $S_1$. Resistance values of the serial resistor $R_{a2}$ and the parallel resistors $R_{b1}$ and $R_{b2}$ are set to be two times a resistance value of the serial resistor $R_{a1}$.

The switches $S_0$ and $S_1$ selectively apply the input voltage $V_i$ and the DC reference voltage $V_{cnt}$ to the parallel resistors $R_{b1}$ and $R_{b2}$ according to a digital control signal input from an external source so that the inverting amplifier 910 varies a voltage gain G for the alternating component of the input voltage $V_i$. Here, the switch $S_1$ corresponds to an MSB of the digital control signal, and the switch $S_0$ corresponds to a LSB of the digital control signal.

Also, if the digital control signal is "1," the switches $S_0$ and $S_1$ apply the input voltage $V_i$ to the parallel resistors $R_{b1}$ and $R_{b2}$. If the digital control signal is "0," the switches $S_0$ and $S_1$ selectively apply the DC reference voltage $V_{cnt}$ to the parallel resistors $R_{b1}$ and $R_{b2}$. The voltage gain G varying with the digital control signal is the same as the voltage gain G varying with the digital control signal in the non-inverting amplifier 710 shown in FIG. 7. Thus, the description of the voltage gain G will be omitted.

The resistor $R_f$ feeds back the output voltage $V_a$ to the inverting terminal of the OP AMP 911, and a resistance value thereof is set to be N times the resistance value of $R_{a1}$. Here, N is a constant that is a maximum voltage gain $G_{max}$ for the alternating component of the input voltage $V_i$.

According to above-described structure, if the input voltage $V_i$ and the DC reference voltage $V_{cnt}$ are input, the inverting amplifier 910 outputs the voltage $V_a$ having a magnitude of "$[(V_{cnt}-V_i)\times G]+V_{cnt}+N\times V_{os}$" through Equation 2, and the output voltage $V_a$ of the inverting amplifier 910 includes an undesired DC offset component N×Vos.

Figure 12:
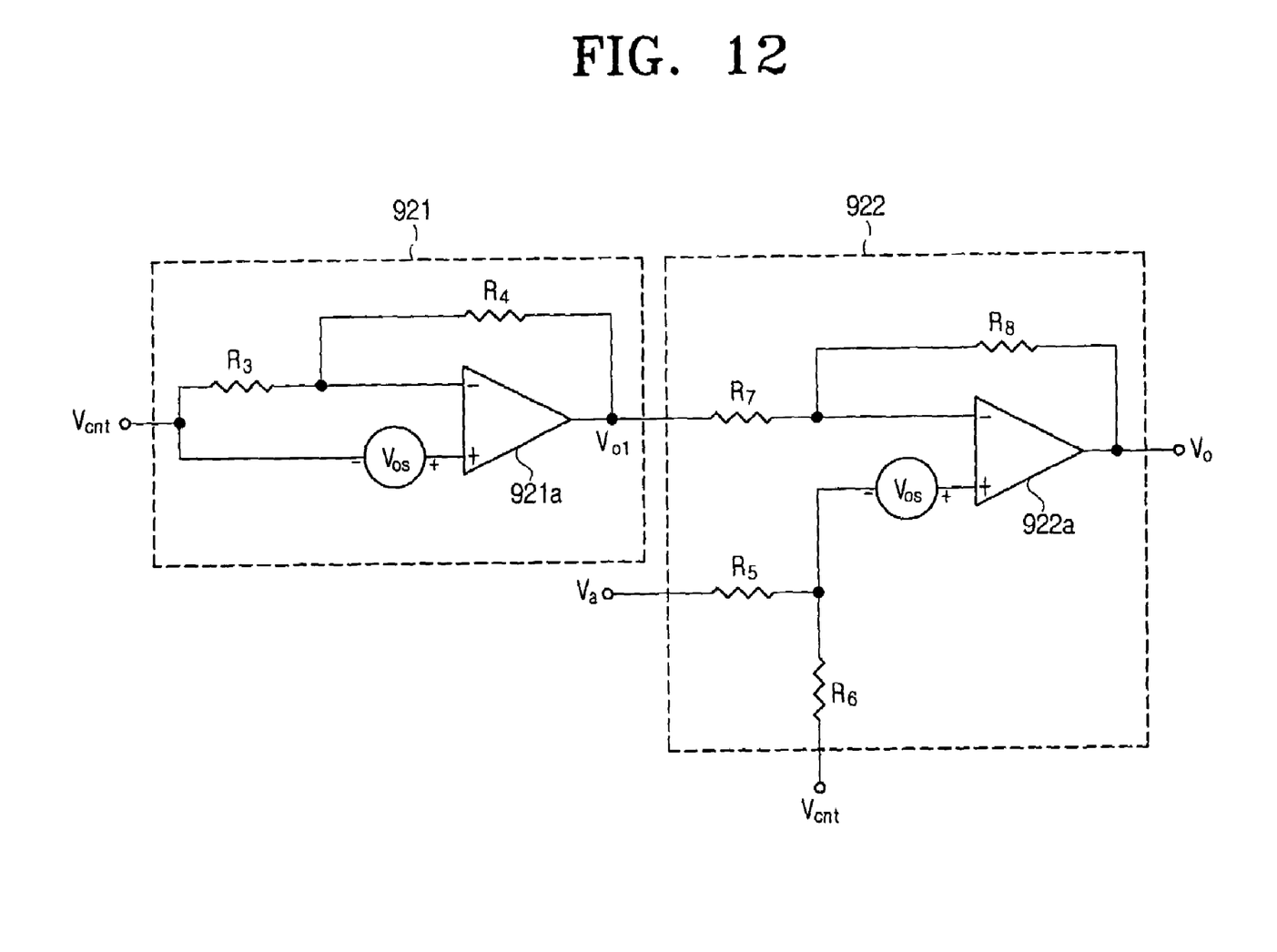
FIG. 12 is a detailed circuit diagram of an offset compensator shown in FIG. 11.

The offset compensator 920 removing the DC offset component $N\times V_{os}$ of the output voltage $V_a$ of the non-inverting amplifier 910 will now be described with reference to FIG. 12.

The offset compensator 920 according to the present invention includes second and third OP AMP units 921 and 922, receives the output voltage $V_a$ of the non-inverting amplifier 910, and removes and outputs the DC offset component $N\times V_{os}$ from the output voltage $V_a$.

The second OP AMP unit 921 is constituted so that the DC reference voltage $V_{cnt}$ is directly applied to a non-inverting terminal of an OP AMP 921a and simultaneously through a resistor $R_3$ to an inverting terminal of the OP AMP 921a. Also, a resistor $R_4$ feeds back an output voltage of the OP AMP 921a to the inverting terminal of the OP AMP 921a and has a resistance value obtained by multiplying a magnitude of the resistor $R_3$ by N+1. According to this structure, a magnitude of an output voltage $V_{o1}$ of the OP AMP 921a is "$V_{cnt}+[(N+2)\times V_{os}]$."

The third OP AMP unit 922 is constituted so that the output voltage $V_{o1}$ of the OP AMP 921a is applied to an inverting terminal of an OP AMP 922a, the output voltage $V_a$ and the DC reference voltage $V_{cnt}$ are distributed to be applied to a non-inverting terminal of the OP AMP 922*a*, and an output voltage $V_o$ of the OP AMP 922*a* is fed back through a resistor $R_8$ to the inverting terminal of the OP AMP 922*a*. Here, resistance values of the resistors $R_3$, $R_5$, $R_6$, $R_7$, and $R_8$ are the same, and a resistance value of a resistor $R_4$ is N+1 times a resistance value of the resistor $R_3$. According to this structure, a magnitude of the output voltage $V_o$ of the OP AMP 922*a* is $V_{cnt}$.

Accordingly, the offset compensator 920 removes the DC offset component from the output voltage $V_a$ of the inverting amplifier 921 and outputs a voltage obtained by amplifying an alternating component of the input voltage $V_i$ by a voltage gain G based on the DC reference voltage $V_{cnt}$.

Figure 13:
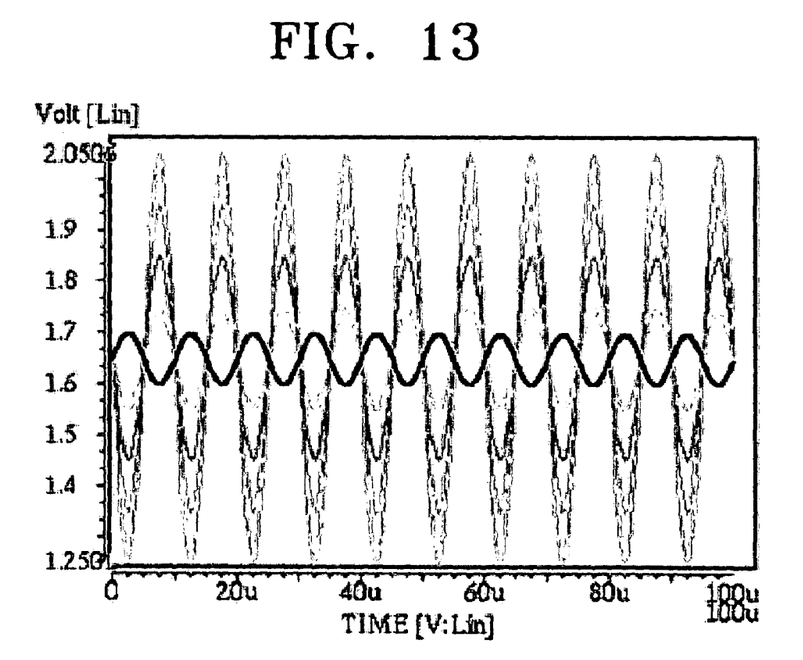
FIG. 13 is a graph illustrating a relationship between input and output voltages of the gain control amplifier shown in FIG. 11.

FIG. 13 is a graph illustrating a relationship between input and output voltages of the gain control amplifier shown in FIG. 11. Here, a horizontal axis denotes a time, and a vertical axis denotes magnitudes of the input and output voltages. A bold line denotes the input voltage $V_i$, and slender solid lines denote the output voltage $V_o$ obtained by amplifying the alternating component of the input voltage $V_i$ using the voltage gains 2, 4, 6, or 8. If an input offset voltage is −20 mV, 0 mV, or 20 mV, a DC offset component does not occur in the output voltage $V_o$, and a DC level is kept at 1.65V as shown in FIG. 13.

As described above, in a gain control amplifier according to the present invention, a DC offset component of an output voltage can be completely removed.

Also, in a case where a voltage gain is controlled at $2^N$ stages using an N-bit digital control signal, an N-to-$2^N$ decoder is not required, and 2N resistors are required in terms of feedback resistance. Thus, the area of a chip can be reduced.

The foregoing embodiment and advantages are merely exemplary and are not to be construed as limiting the present invention. The present teaching can be readily applied to other types of apparatuses. Also, the description of the embodiments of the present invention is intended to be illustrative, and not to limit the scope of the claims, and many alternatives, modifications, and variations will be apparent to those skilled in the art.

What is claimed is:

1. A gain control amplifier comprising:
   a non-inverting amplifier receiving an input voltage and a direct current reference voltage, and non-inverting amplifying and outputting an alternating component of the input voltage using a predetermined voltage gain based on the direct current reference voltage; and
   an offset compensator removing a direct current offset component from an output voltage of the non-inverting amplifier using at least two operational amplifiers.

2. The gain control amplifier of claim 1, wherein the non-inverting amplifier comprises:
   a ladder-shaped resistor varying the voltage gain according to a digital control signal input from an external source; and
   a first operational amplifier unit comprising a first operational amplifier, receiving a voltage output from the ladder-shaped resistor via an inverting terminal, and receiving the input voltage and the offset compensation voltage via a non-inverting terminal.

3. The gain control amplifier of claim 2, wherein the first operational amplifier unit further comprises:
   a first resistor comprising an end connected to the inverting terminal of the first operational amplifier and another end connected to an output terminal of the first operational amplifier;
   a second resistor comprising an end receiving the input voltage and another end connected to the non-inverting terminal of the first operational amplifier; and
   a third resistor comprising an end receiving the offset compensation voltage and another end connected to the non-inverting terminal of the first operation amplifier,
   wherein the second and third resistors each have a resistance value obtained by multiplying a magnitude of the first resistor by N.

4. The gain control amplifier of claim 3, wherein the ladder-shaped resistor comprises:
   a second resistor comprising an end receiving the direct current reference voltage;
   a plurality of serial resistors connected in series between another end of the second resistor and the inverting terminal of the first operational amplifier;
   a plurality of parallel resistors comprising ends connected to the plurality of serial resistors to form an R-2R ladder structure; and
   a plurality of switches selectively applying one of the input voltage and the direct current reference voltage to other ends of the plurality of parallel resistors according to the digital control signal.

5. The gain control amplifier of claim 4, wherein:
   the serial resistors each have an identical magnitude to the first resistor, and
   resistance values of the second resistor and the parallel resistors are two times a resistance value of the first resistor.

6. The gain control amplifier of claim 5, wherein the first operational amplifier unit comprises:
   a third resistor comprising an end connected to the inverting terminal of the first operational amplifier and another end connected to an output terminal of the first operational amplifier;
   a fourth resistor comprising an end receiving the input voltage and another end connected to the non-inverting terminal of the first operational amplifier; and
   a fifth resistor comprising an end receiving the offset compensation voltage and another end connected to the non-inverting terminal of the first operational amplifier.

7. The gain control amplifier of claim 6, wherein the offset compensator comprises:
   a second operational amplifier unit comprising a second operational amplifier, receiving the direct current reference voltage, and outputting a voltage having a magnitude obtained by adding a voltage comprising a direct current offset component of the second operational amplifier amplified to a predetermined magnitude to the direct current reference voltage; and
   a third operational amplifier unit comprising a third operational amplifier comprising an inverting terminal receiving an output voltage of the second operational amplifier unit and a non-inverting terminal receiving the direct current reference voltage.

8. The gain control amplifier of claim 7, wherein the second operational amplifier unit comprises:
   a sixth resistor comprising an end connected to an inverting terminal of the second operational amplifier and another end receiving the direct current reference voltage; and
   a seventh resistor comprising an end connected to the inverting terminal of the second operational amplifier and another end connected to an output terminal of the second operational amplifier,
   wherein the seventh resistor has a resistance value having a magnitude obtained by multiplying a magnitude of the sixth resistor by N+1.

9. The gain control amplifier of claim 8, wherein the third operational amplifier unit comprises:
- an eighth resistor comprising an end receiving an output voltage of the second operational amplifier and another end connected to the non-inverting terminal of the third operational amplifier; and
- a ninth resistor comprising an end connected to the inverting terminal of the third operational amplifier and another end connected to the output terminal of the second operational amplifier,
- wherein the eighth and ninth resistors each have a resistance value having an identical magnitude as a magnitude of the sixth resistor.

10. The gain control amplifier of claim 9, wherein the offset compensation voltage is expressed as the equation below:

$$V_{o2} = V_{cnt} - N \times V_{os}$$

wherein $V_{o2}$ denotes the offset compensation voltage, $V_{cnt}$ denotes the direct current reference voltage, $V_{os}$ denotes a direct current offset voltage of the first, second, and third operational amplifiers, and N is a constant.

11. A gain control amplifier comprising:
- an inverting amplifier receiving an input voltage and a direct current reference voltage, and inverting amplifying and outputting an alternating component of the input voltage using a predetermined voltage gain based on the direct current reference voltage; and
- an offset compensator receiving an output voltage of the inverting amplifier and removing a direct current offset component from the output voltage.

12. The gain control amplifier of claim 11, wherein the inverting amplifier comprises:
- a ladder-shaped resistor varying the voltage gain according to a digital control signal input from an external source; and
- a first operational amplifier unit comprising a first operational amplifier, receiving a voltage output from the ladder-shaped resistor via an inverting terminal, and receiving the direct current reference voltage via a non-inverting terminal.

13. The gain control amplifier of claim 12, wherein the first operational amplifier unit further comprises:
- a first resistor comprising an end connected to the inverting terminal of the first operational amplifier and another end connected to an output terminal of the first operational amplifier.

14. The gain control amplifier of claim 13, wherein the ladder-shaped resistor comprises:
- a second resistor comprising an end receiving the direct current reference voltage;
- a plurality of serial resistors connected in series between another end of the second resistor and the inverting terminal of the first operational amplifier;
- a plurality of parallel resistors comprising ends connected to connecting nodes of the plurality of serial resistors; and
- a plurality of switches selectively applying one of the input voltage and the direct current reference voltage to other ends of the plurality of parallel resistors according to the digital control signal.

15. The gain control amplifier of claim 14, wherein:
- resistance values of the second resistor and the parallel resistors are two times resistance values of the serial resistors, and the first resistor has a resistance value having a magnitude obtained by multiplying magnitudes of the serial resistors by N.

16. The gain control amplifier of claim 15, wherein the offset compensator comprises:
- a second operational amplifier unit comprising a second operational amplifier, receiving the direct current reference voltage, and outputting a voltage having a magnitude obtained by adding a voltage comprising a direct current offset component of the second operational amplifier amplified to a predetermined magnitude to the direct current reference voltage; and
- a third operational amplifier unit comprising a third operational amplifier comprising an inverting terminal receiving an output voltage of the second operation amplifier unit and a non-inverting terminal receiving the output voltage of the inverting amplifier and the direct current reference voltage.

17. The gain control amplifier of claim 16, wherein the inverting amplifier outputs the voltage expressed as the equation below using a predetermined operational amplifier:

$$V_a = (V_{cnt} - V_i) \times G + V_{cnt} + N \times V_{os}$$

wherein $V_a$ denotes the output voltage of the inverting amplifier, $V_i$ denotes the input voltage, G denotes the voltage gain, $V_{cnt}$ denotes the direct current reference voltage, $V_{os}$ denotes a direct current offset voltage of the predetermined operational amplifier, and N is a constant.

18. The gain control amplifier of claim 16, wherein the second operational amplifier unit comprises:
- a third resistor comprising an end connected to an inverting input terminal of the second operational amplifier and another end receiving the direct current reference voltage; and
- a fourth resistor comprising an end connected to the inverting input terminal of the second operational amplifier and another end connected to an output terminal of the second operational amplifier.

19. The gain control amplifier of claim 18, wherein the third resistor has a resistance value having a magnitude obtained by multiplying a magnitude of the fourth resistor by N+1.

20. The gain control amplifier of claim 16, wherein the third operational amplifier unit comprises:
- a fifth resistor comprising an end receiving the output voltage of the inverting amplifier and another end connected to a non-inverting terminal of the third operational amplifier;
- a sixth resistor comprising an end receiving the direct current reference voltage and another end connected to the non-inverting terminal of the third operational amplifier;
- a seventh resistor comprising an end receiving an output voltage of the second operational amplifier unit and another end connected to the inverting terminal of the third operational amplifier; and
- an eighth resistor comprising an end connected to the inverting terminal of the third operational amplifier and another end connected to the output terminal of the third operational amplifier.

21. The gain control amplifier of claim 20, wherein the fifth through eighth resistors each have an identical magnitude to the third resistor.

* * * * *